United States Patent
Chonlamaitri et al.

(10) Patent No.: US 8,663,433 B2
(45) Date of Patent: Mar. 4, 2014

(54) COATED ARTICLE WITH LOW-E COATING INCLUDING ZIRCONIUM SILICON OXYNITRIDE AND METHODS OF MAKING SAME

(75) Inventors: Ratchaneekorn Chonlamaitri, Ypsilanti, MI (US); Anton Dietrich, Fontnas (CH); Bernd Disteldorf, Mettlach (DE)

(73) Assignees: Guardian Industries Corp., Auburn Hills, MI (US); Centre Luxembourg de Recherches pour le Verre et la Ceramique S.A. (C.R.V.C.), Luxembourg (LU)

(*) Notice: Subject to any disclaimer, the term of this patent is extended or adjusted under 35 U.S.C. 154(b) by 2142 days.

(21) Appl. No.: 11/581,360

(22) Filed: Oct. 17, 2006

(65) Prior Publication Data

US 2007/0036986 A1 Feb. 15, 2007

Related U.S. Application Data (62) Division of application No. 11/004,225, filed on Dec. 6, 2004, now Pat. No. 7,153,578.

(51) Int. Cl.
   *C23C 14/34* (2006.01)
(52) U.S. Cl.
   USPC ............ 204/192.26; 204/192.27; 204/192.28; 204/192.29
(58) Field of Classification Search
   USPC ............. 204/192.26, 192.27, 192.28, 192.29
   See application file for complete search history.

(56) References Cited

U.S. PATENT DOCUMENTS

| | | | |
|---|---|---|---|
| 4,769,291 A * | 9/1988 | Belkind et al. | 428/630 |
| 5,199,979 A | 4/1993 | Lin et al. | |
| 5,279,722 A | 1/1994 | Szczyrbowski et al. | |
| 5,552,180 A | 9/1996 | Finley et al. | |
| 6,106,605 A | 8/2000 | Basil et al. | |
| 6,291,867 B1 | 9/2001 | Wallace et al. | |
| 6,440,592 B1 | 8/2002 | Meyer et al. | |
| 6,495,251 B1 | 12/2002 | Arbab et al. | |
| 6,576,349 B2 | 6/2003 | Lingle et al. | |
| 6,586,102 B1 | 7/2003 | Stachowiak | |
| 6,589,658 B1 | 7/2003 | Stachowiak | |
| 6,632,491 B1 | 10/2003 | Thomsen et al. | |
| 6,686,050 B2 | 2/2004 | Lingle et al. | |

(Continued)

FOREIGN PATENT DOCUMENTS

| EP | 0 543 077 | 5/1993 |
|---|---|---|
| JP | 03-232745 | * 10/1991 |

(Continued)

OTHER PUBLICATIONS

Machine Translation Susumu Suzuki et al. of JP 06-067019 dated Nov. 1994.*

(Continued)

*Primary Examiner* — Rodney McDonald
(74) *Attorney, Agent, or Firm* — Nixon & Vanderhye P.C.

(57) ABSTRACT

A coated article is provided with at least one infrared (IR) reflecting layer. In certain embodiments, the coating is provided with at least one layer of zirconium silicon oxynitride (e.g., $ZrSiO_xN_y$), for improving the coated article's ability to block of UV radiation. The oxygen content of the layer may be adjusted in order to tune the coating's visible transmission versus UV blockage.

21 Claims, 6 Drawing Sheets

(56) References Cited

U.S. PATENT DOCUMENTS

| | | | |
|---|---|---|---|
| 6,716,532 | B2 | 4/2004 | Neuman et al. |
| 6,749,941 | B2 | 6/2004 | Lingle |
| 6,802,943 | B2 | 10/2004 | Stachowiak |
| 6,808,606 | B2 | 10/2004 | Thomsen et al. |
| 7,153,578 | B2 | 12/2006 | Chonlamaitri et al. |
| 2003/0170466 | A1 | 9/2003 | Stachowiak |
| 2004/0197574 | A1 | 10/2004 | Stachowiak |
| 2004/0214012 | A1 | 10/2004 | Stachowiak |
| 2004/0214013 | A1 | 10/2004 | Stachowiak et al. |
| 2004/0224167 | A1 | 11/2004 | Stachowiak |

FOREIGN PATENT DOCUMENTS

| | | |
|---|---|---|
| JP | 06-067019 | 3/1994 |
| WO | WO 98/58885 | 12/1998 |
| WO | WO 03/033427 | 4/2003 |

OTHER PUBLICATIONS

Translation of JP 03-232745 publication date Oct. 16, 1991.*
U.S. Appl. No. 11/037,453, filed Jan. 19, 2005.
U.S. Appl. No. 11/004,225, filed Dec. 6, 2004.
Supplementary European Search Report dated Apr. 29, 2011.

* cited by examiner

COATED ARTICLE WITH LOW-E COATING INCLUDING ZIRCONIUM SILICON OXYNITRIDE AND METHODS OF MAKING SAME

This application is a divisional of application Ser. No. 11/004,225, filed Dec. 6, 2004, now U.S. Pat. No. 7,153,578 the entire content of which is hereby incorporated herein by reference in this application.

This application relates to a coated article including at least one infrared (IR) reflecting layer of a material such as silver or the like in a low-E coating. In certain embodiments, at least one layer of the coating is of or includes zirconium silicon oxynitride (e.g., $ZrSiO_xN_y$). In certain example embodiments, the provision of a layer comprising zirconium silicon oxynitride permits a layer to be used which has a high refractive index and an adjustable ultraviolet (UV) absorption. Thus, in certain example embodiments, UV absorption for example may be improved if desired. Coated articles herein may be used in the context of insulating glass (IG) window units, vehicle windows, or in other suitable applications such as monolithic window applications, laminated windows, and/or the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like. In certain example instances, designers of coated articles often strive for a combination of high visible transmission, low emissivity (or low emittance), and/or low sheet resistance ($R_s$). High visible transmission may permit coated articles to be used in applications where these characteristics are desired such as in architectural or vehicle window applications, whereas low-emissivity (low-E), and low sheet resistance characteristics permit such coated articles to block significant amounts of IR radiation so as to reduce for example undesirable heating of vehicle or building interiors. Thus, typically, for coatings used on architectural glass to block significant amounts of IR radiation, high transmission in the visible spectrum is often desired. However, low transmittance and/or high reflectance in the IR and/or near IR part(s) of the spectrum is also desired to reduce for example undesirable heating of vehicle or building interiors.

Unfortunately, low-E coatings often do not block significant amounts of ultraviolet (UV) radiation. In other words, low-E coatings typically provide only moderate or negligible UV protection, since the materials used in the layer stacks are transparent for short wavelengths (e.g., below 400 nm). In particular, materials used in such layer stacks such as tin oxide and titanium oxide cannot provide adequate UV protection given the small thicknesses of such materials required for low-E coatings. Thus, even with such coatings are provided on windows such as IG windows or vehicle windows, significant amounts of UV radiation makes its way through the window and into the building or vehicle. UV radiation tends to damage furniture and other elements inside of buildings or vehicles.

Materials such as vanadium oxide and cerium oxide absorb significant amounts of UV radiation. However, while such materials are characterized by a very steep onset of absorption for UV radiation, the onset of radiation absorption occurs in significant part in the visible part of the spectrum thereby leading to a significant distortion of colors when look through such a coating (e.g., a yellow shift). Accordingly, viewing characteristics tend to be degraded when layers of such materials are used.

In view of the above, it will be appreciated that there exists a need in the art for a coated article including a low-E coating which is capable of blocking at some UV radiation in an efficient manner. Certain example embodiments of this invention relate to a coated article which permits significant UV absorption properties to be achieved.

In certain example embodiments of this invention, it has surprisingly been found that the provision of a layer consisting essentially of, or comprising, zirconium silicon oxynitride (e.g., $ZrSiO_xN_y$) unexpectedly improves blocking (reflecting and/or absorption) of UV radiation in a manner which does not significantly degrade other optical properties of a coated article such as visible transmission and/or color.

In certain example embodiments of this invention, a layer of zirconium silicon oxynitride may be tuned in a manner so as to achieve a desired amount of UV blocking and/or absorption. It has been found that zirconium silicon oxynitride has optical constants (n and k) which allow adjustment of the onset of absorption by varying oxygen content of the layer for example. Moreover, it has been found that zirconium silicon oxynitride has a refractive index (n) in a range which is very adaptable to low-E coatings, so that such layer(s) may be used in low-E coatings without significantly changing the visible appearance of the coated article or certain performance data. Thus, in certain example embodiments of this invention, the absorption edge of the curve defined by a layer of zirconium silicon oxynitride can be adjusted by changing the oxygen content thereof, which may be done for example by adjusting the amount of oxygen introduced into the sputtering chamber(s) during reactive sputter-deposition of the layer. In particular, for example, as oxygen content of the layer increases, the absorption edge of the curve defined by the layer of zirconium silicon oxynitride moves toward lower wavelengths away from certain visible wavelengths. Thus, in certain example embodiments, a balancing or tuning can be performed so as to achieve a desired balance between visible transmission and UV absorption.

In certain example embodiments of this invention, there is provided a coated article including a coating supported by a glass substrate, the coating comprising a first layer; an infrared (IR) reflecting layer comprising silver located on the substrate over at least the first layer; a second layer located on the substrate and over at least the IR reflecting layer and the first layer; and wherein the first layer and/or the second layer comprises zirconium silicon oxynitride.

In other example embodiments of this invention, there is provided a window unit (e.g., IG window unit, monolithic window, or vehicle windshield) comprising a glass substrate which supports at least one infrared (IR) reflecting layer and at least one layer comprising zirconium silicon oxynitride.

In other example embodiments of this invention, there is provided method of making a coated article, the method comprising providing a substrate (e.g., glass substrate); sputtering a target comprising zirconium and silicon in an atmosphere comprising oxygen and nitrogen in order to form a layer comprising zirconium silicon oxynitride; and providing an IR reflecting layer on the substrate over or under the layer comprising zirconium silicon oxynitride.

DETAILED DESCRIPTION OF EXAMPLE EMBODIMENTS OF THE INVENTION

Referring now to the drawings in which like reference numerals indicate like parts throughout the several views.

Coated articles herein may be used in coated article applications such as monolithic windows, IG window units, vehicle windows, and/or any other suitable application that includes single or multiple substrates such as glass substrates.

Certain embodiments of this invention relate to a coated article which includes at least one glass substrate supporting a coating. The coating typically has at least one infrared (IR) reflecting layer which reflects and/or blocks at least some IR radiation. The IR reflecting layer(s) may be of a material such as silver, gold, NiCr or the like in different embodiments of this invention. Often, an IR reflecting layer is sandwiched between at least first and second dielectric layers of the coating. In certain example embodiments of this invention, it has surprisingly been found that the provision of a layer consisting essentially of, or comprising, zirconium silicon oxynitride (e.g., $ZrSiO_xN_y$) as a dielectric layer(s) of such a coating unexpectedly improves blocking (reflecting and/or absorption) of TV radiation in a manner which does not significantly degrade other optical properties of a coated article such as visible transmission and/or color. One or more such zirconium silicon oxynitride layers may be provided in a given coating in different embodiments of this invention. Moreover, such zirconium silicon oxynitride layer(s) may be provided in any type of solar control or low-E (low-emissivity, or low-emittance) coating in different embodiments of this invention, and the specific low-E coatings described herein are for purposes of example only unless recited in the claim(s). In the drawings, example layers of or including zirconium silicon oxynitride are referred to by reference numerals 2, 3, 13 and 16.

In certain example embodiments of this invention, a layer of zirconium silicon oxynitride may be tuned in a manner so as to achieve a desired amount of UV blocking and/or absorption. It has been found that zirconium silicon oxynitride has optical constants (n and k) which allow adjustment of the onset of absorption by varying oxygen content of the layer for example. Moreover, it has been found that zirconium silicon oxynitride has a refractive index (n) in a range which is very adaptable to low-E coatings, so that such layer(s) may be used in low-E coatings without significantly changing the visible appearance of the coated article or certain performance data. Thus, in certain example embodiments of this invention, the absorption edge of the curve defined by a layer of zirconium silicon oxynitride can be adjusted by changing the oxygen content thereof, which may be done for example by adjusting the amount of oxygen introduced into the sputtering chamber(s) during reactive sputter-deposition of the layer. In particular, for example, as oxygen content of the layer increases, the absorption edge of the curve defined by the layer of zirconium silicon oxynitride moves toward lower wavelengths away from certain visible wavelengths. Thus, in certain example embodiments, a balancing or tuning can be performed so as to achieve a desired balance between visible transmission and UV absorption.

In certain example embodiments of this invention, zirconium silicon oxynitride may be used to replace a layer of silicon nitride, or as an addition layer directly on top of or directly under a layer of or comprising silicon nitride. The use of a layer of zirconium silicon oxynitride in this respect has surprisingly been found to improve chemical stability and heat stability, and zirconium silicon oxynitride has also been found to be stable during sputtering processing.

Figure 4:
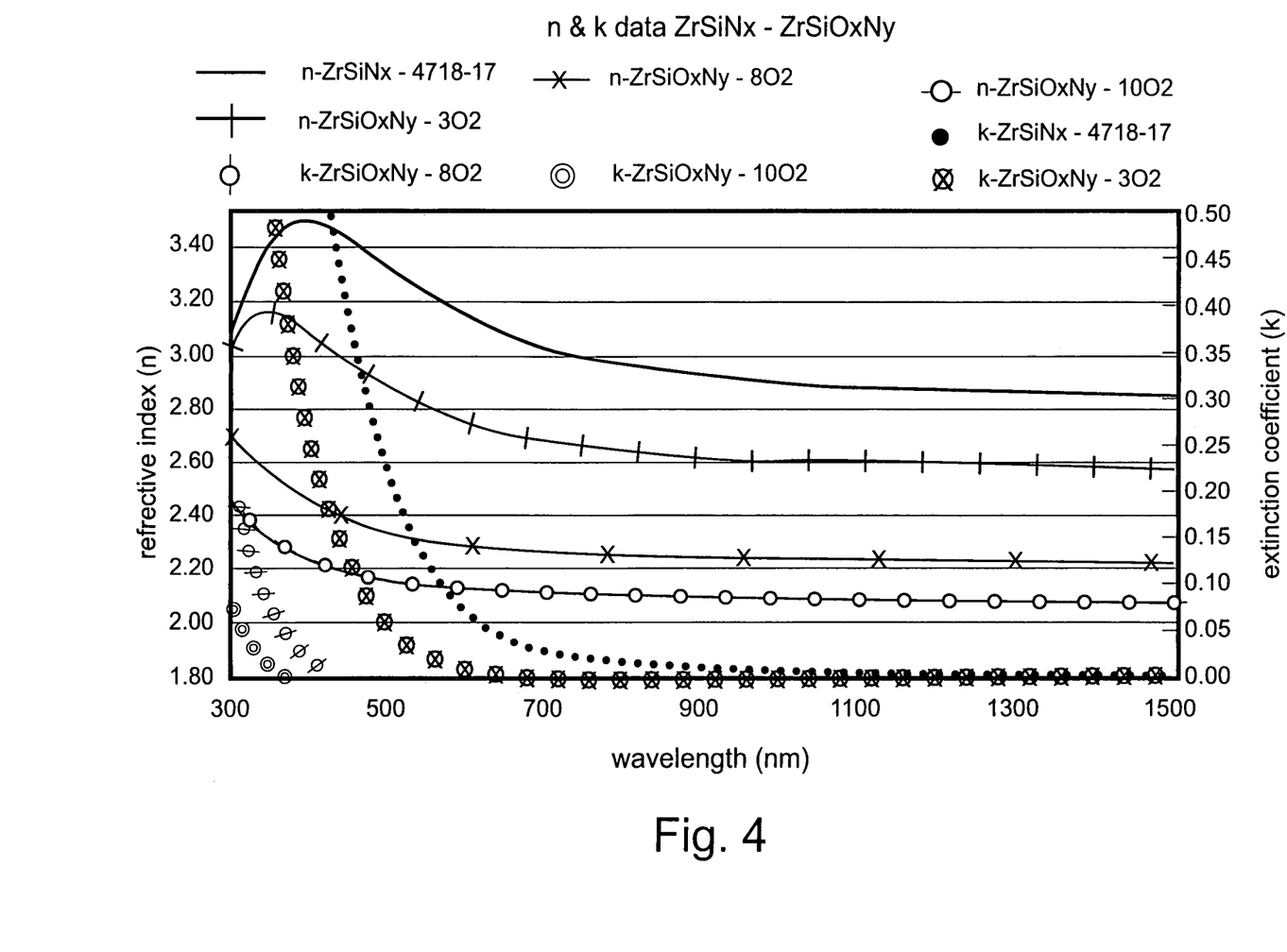
FIG. 4 is a graph illustrating n and k values for various layers according to different example embodiments of this invention where n and k are shown to vary with oxygen content of the layer.

FIG. 4 is a graph plotting optical constants, in particular refractive index (n) and extinction coefficient (k), at different wavelengths for layers according to different example embodiment of this invention, with the data being determined by ellipsometry. Four different layers are plotted, with respect to n and k, in FIG. 4. In particular, FIG. 4 plots the following four layers: (a) zirconium silicon nitride with 0 sccm oxygen gas flow in the sputter-deposition chamber; (b) zirconium silicon oxynitride with 3 sccm oxygen gas flow in the sputter-deposition chamber; (c) zirconium silicon oxynitride with 8 sccm oxygen gas flow in the sputter-deposition chamber; and (d) zirconium silicon oxynitride with 10 sccm oxygen gas flow in the sputter-deposition chamber. The thickness of each of the four layers was 205 Å, 196 Å, 180 Å and 185 Å, respectively. It can be seen that the oxygen content of the layer was progressively increased from the first layer to the fourth layer. Each layer was deposited using a sputtering target including 60% Zr and 40% Si. In depositing each of the four layers, 40 sccm Ar gas and 55 sccm $N_2$ gas was used for flowing in the sputtering chamber, and a power of 2.5 kW was used and from about 458-489 V.

As can be seen in FIG. 4, a layer of zirconium silicon oxynitride may be tuned in a manner so as to achieve a desired amount of UV blocking and/or absorption by adjusting the amount of oxygen in the layer. In particular, n and k of the layer can be tuned by adjusting the amount of oxygen used in the sputtering process and thus in the layer. FIG. 4 illustrates that as oxygen content of the layer increases, the absorption edge of the curve defined by the layer of zirconium silicon oxynitride moves toward lower wavelengths (UV wavelengths) and away from certain visible wavelengths. For instance, in FIG. 4 it can be seen that the refractive index (n) peak, or leading edge closest to the center visible wavelength, shifts to the left (toward lower wavelengths, away from the visible) as oxygen content increases. Moreover, it can also be seen that the leading edge of the extinction coefficient (k) curve closest to the center visible also shifts to the left (toward lower wavelengths, away from the visible) as oxygen content increases.

In certain example embodiments of this invention, the oxygen content of the zirconium silicon oxynitride layer(s) is adjusted so that the zirconium silicon oxynitride inclusive layer has an index of refraction (n) (at a wavelength of 550 nm) of from about 1.6 to 2.8, more preferably from about 1.7 to 2.5, and even more preferably from about 1.8 to 2.4. Moreover, the oxygen content of the zirconium silicon oxynitride layer(s) is adjusted so that the zirconium silicon oxynitride inclusive layer has an extinction coefficient (k) (at a wavelength of 550 nm) of no greater than about 2.3, more preferably no greater than about 2.0, even more preferably no greater than about 1.8. Tuning of the oxygen content of the zirconium silicon oxynitride in such a manner has been found to permit good UV absorption to be achieved in combination with not significantly adversely affecting visible characteristics of the coated article. Moreover, tuning of the oxygen content in such a manner causes the zirconium silicon oxynitride to have a refractive index which is close to that of certain layers often used in low-E coatings such as oxides of Ti, Sn, Zn and/or the like. As an example, the absorption edge of a zirconium silicon oxynitride layer can be moved over a large wavelength range and may be positioned above, below, or substantially on a ZnO reference edge merely by changing the oxidation level of the layer thereby permitting it to substantially match ZnO from an optical perspective in certain example instances. Thus, such zirconium silicon oxynitride may replace part of all of such layers in low-E coatings in certain situations without significantly adversely affecting visible characteristics of the coated article. The achievable UV protection is largely dependent on the position of the absorption edge and the layer thickness required by the optical properties of the overall coating.

Moreover, in forming the zirconium silicon oxynitride layer(s) according to certain example embodiments of this invention (e.g., via reactive sputtering), the ratio of nitrogen/oxygen (e.g., $N_2/O_2$) gas used in the sputter chamber is no greater than about 25, more preferably no greater than about 18, more preferably no greater than about 10. In certain example embodiments of this invention, the ratio of nitrogen/oxygen (e.g., $N_2/O_2$) gas used in the sputter chamber in forming a layer of or including zirconium silicon oxynitride is from about 1 to 25, more preferably from about 2 to 18, and sometimes from about 2 to 10. Additionally, according to certain example embodiments of this invention, a zirconium silicon oxynitride layer (e.g., 2, 3, 13, and/or 16) is characterized by a ratio of nitrogen to oxygen (atomic percent) therein of from about 1 to 25, more preferably from about 2 to 18, and sometimes from about 2 to 10. Of course, other gases such as Ar may also be used in the sputtering chamber along with oxygen and nitrogen when sputter depositing a layer of zirconium silicon oxynitride. In certain example embodiments, the amount of Ar gas used in sputtering is greater than the amount of oxygen but less than the amount of nitrogen used in forming a layer of zirconium silicon oxynitride. For example, in certain example embodiments, the gas ratio used in sputter depositing a layer of zirconium silicon oxynitride is 40 ml Ar, 55 ml $N_2$ and 10 ml $O_2$.

Moreover, in certain example embodiments of this invention, the peak of the refractive index curve (e.g., see FIG. 4) for a layer of zirconium silicon oxynitride is at a wavelength shorter than about 400 nm, more preferably shorter than about 375 nm, and sometimes shorter than about 350 nm, and even sometimes shorter than about 300 nm.

In addition to the aforesaid advantageous optical properties, zirconium silicon oxynitride layers according to different embodiments of this invention realize good mechanical and chemical durability. Thus, such layers may be suitable for use in base coats or overcoats in solar control and/or low-E coatings for example.

In certain example embodiments of this invention, the Zr/Si ratio (atomic percent) in an example zirconium silicon oxynitride layer may be from about 0.25 to 5.0, more preferably from about 0.5 to 4, even more preferably from about 0.75 to 3.0, and still more preferably from about 1.0 to 2.0, and most preferably from about 1.25 to 1.75. Thus, in certain example embodiments of this invention there is more Zr than Si in a layer of or including zirconium silicon oxynitride in terms of atomic percent. Moreover, in certain example embodiments, an example zirconium silicon oxynitride layer may be from about 20 to 400 Å thick, more preferably from about 40 to 300 Å thick, and even more preferably from about 50 to 250 Å thick.

As explained above, zirconium silicon oxynitride layers according to different example embodiments of this invention may be used in various locations in solar control coatings. The coatings described below are provided for purposes of example.

Figure 1:
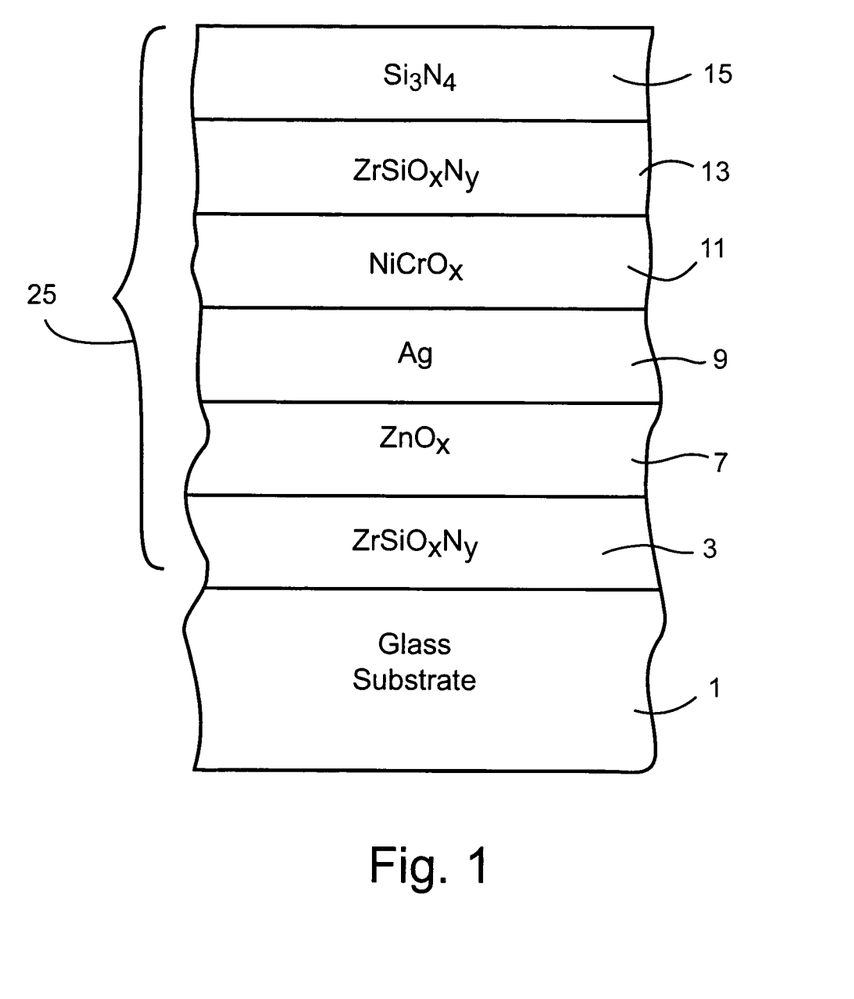
FIG. 1 is a cross sectional view of a coated article according to an example embodiment of this invention.

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate either directly or indirectly. As shown in FIG. 1, the coating 25 comprises dielectric layer 3, zinc oxide inclusive layer 7, IR reflecting layer 9 including or of silver, gold, or the like, upper contact layer 11 of or including an oxide of nickel chrome (e.g., $NiCrO_x$), dielectric layer 13, and dielectric layer 15 of or including a material such as silicon nitride and/or silicon oxynitride which may in certain example instances be a protective overcoat. Other layers and/or materials may also be provided in certain example embodiments of this invention, and it is also possible that certain layers may be removed or split in certain example instances.

Still referring to the FIG. 1 embodiment, for purposes of example only, one or both of layers 3, 13 may be of or include zirconium silicon oxynitride in certain example embodiments of this invention. In one example embodiment, both layers 3 and 13 are of or include zirconium silicon oxynitride. In another example embodiment of this invention, layer 3 is of or includes zirconium silicon oxynitride and layer 13 is of or includes tin oxide. In yet another example embodiment of this invention, layer 13 is of or includes zirconium silicon oxynitride and layer 3 is of or includes titanium oxide (e.g., $TiO_2$) or silicon nitride.

Lower contact layer 7 in certain embodiments of this invention is of or includes zinc oxide (e.g., ZnO). The zinc oxide of layer(s) 7 and/or 13 may contain other materials as well such as Al (e.g., to form $ZnAlO_x$) in certain example embodiments. For example, in certain example embodiments of this invention, zinc oxide layer 7 may be doped with from about 1 to 10% Al (or B), more preferably from about 1 to 5% Al (or B), and most preferably about 2 to 4% Al (or B). The use of zinc oxide 7 under the silver in layer 9 allows for an excellent quality of silver to be achieved.

Infrared (IR) reflecting layer 9 is preferably substantially or entirely metallic and/or conductive, and may comprise or consist essentially of silver (Ag), gold, or any other suitable IR reflecting material. IR reflecting layer 9 helps allow the coating to have low-E and/or good solar control characteristics such as low emittance, low sheet resistance, and so forth. The IR reflecting layer 9 may, however, be slightly oxidized in certain embodiments of this invention.

The upper contact layer 11 may be of or include an oxide of Ni and/or Cr. In certain example embodiments, upper contact layer 11 may be of or include nickel (Ni) oxide, chromium/chrome (Cr) oxide, or a nickel alloy oxide such as nickel chrome oxide ($NiCrO_x$), or other suitable material(s). The use of, for example, $NiCrO_x$ in this layer allows durability to be improved in certain example instances. The $NiCrO_x$ layer 11 may be fully oxidized in certain embodiments of this invention (i.e., fully stoichiometric), or alternatively may only be partially oxidized. In certain instances, the $NiCrO_x$ layer 11 may be at least about 50% oxidized. Contact layer 11 (e.g., of or including an oxide of Ni and/or Cr) may or may not be oxidation graded in different embodiments of this invention.

Oxidation grading means that the degree of oxidation in the layer changes throughout the thickness of the layer so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers are set forth in U.S. Pat. No. 6,576,349, the disclosure of which is hereby incorporated herein by reference. Contact layer 11 (e.g., of or including an oxide of Ni and/or Cr) may or may not be continuous in different embodiments of this invention across the entire IR reflecting layer.

Dielectric layer 15, which may be an overcoat in certain example instances, may be of or include silicon nitride (e.g., $Si_3N_4$) or any other suitable material in certain example embodiments of this invention such as silicon oxynitride. Optionally, other layers may be provided above layer 15. Layer 15 is provided for durability purposes, and to protect the underlying layers. In certain example embodiments, layer 15 may have an index of refraction (n) of from about 1.9 to 2.2, more preferably from about 1.95 to 2.05.

Other layer(s) below or above the illustrated coating 25 may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate 1 in the FIG. 1 embodiment are as follows, from the glass substrate outwardly (e.g., the Al content in the zinc oxide layer 7 may be from about 1-10%, more preferably from about 1-3% in certain example instances):

TABLE 1

(Example Materials/Thicknesses; FIG. 1 Embodiment)

| Layer | Range (Å) | More Preferred (Å) | Example (Å) |
|---|---|---|---|
| $TiO_x$ or $ZrSiO_xN_y$ (layer 3) | 30-400 Å | 80-250 Å | 180 Å |
| $ZnAlO_x$ (layer 7) | 10-300 Å | 60-120 Å | 50 Å |
| Ag (layer 9) | 50-250 Å | 80-150 Å | 130 Å |
| $NiCrO_x$ (layer 11) | 10-80 Å | 20-70 Å | 30 Å |
| $SnO_2$ or $ZrSiO_xN_y$ (layer 13) | 40-400 Å | 100-200 Å | 160 Å |
| $Si_3N_4$ (layer 15) | 50-750 Å | 150-350 Å | 210 Å |

In certain example embodiments of this invention, coated articles herein may have the following low-E (low emissivity), solar and/or optical characteristics set forth in Table 2 when measured monolithically.

TABLE 2

Low-E/Solar Characteristics (Monolithic)

| Characteristic | General | More Preferred | Most Preferred |
|---|---|---|---|
| $R_s$ (ohms/sq.): | <=6.0 | <=5.0 | <=4.0 |
| $E_n$: | <=0.10 | <=0.08 | <=0.06 |
| $T_{vis}$ (%): | >=50 | >=60 | >=70 |

Moreover, coated articles including coatings according to certain example embodiments of this invention have the following optical characteristics (e.g., when the coating(s) is provided on a clear soda lime silica glass substrate 1 from 1 to 10 mm thick, preferably about 4 mm thick). In Table 3, all parameters are measured monolithically.

TABLE 3

Example Optical Characteristics (Monolithic)

| Characteristic | General | More Preferred |
|---|---|---|
| $T_{vis}$ (or TY)(Ill. C, 2 deg.): | >=60% | >=70% |
| $a^*_t$ (Ill. C, 2°): | −6 to +6 | −4 to +4 |
| $b^*_t$ (Ill. C, 2°): | −10 to +10.0 | −8 to +8 |
| $L^*_t$: | >=89 | >=90 |
| $R_fY$ (Ill. C, 2 deg.): | <=15% | <=12% |
| $a^*_f$ (Ill. C, 2°): | −10 to +10 | −6 to +6 |
| $b^*_f$ (Ill. C, 2°): | −14.0 to +10.0 | −10.0 to +5 |
| $L^*_f$: | 22-30 | 24-27 |
| $R_gY$ (Ill. C, 2 deg.): | <=15% | <=12% |
| $a^*_g$ (Ill. C, 2°): | −10 to +10 | −8 to +8 |
| $b^*_g$ (Ill. C, 2°): | −14.0 to +10.0 | −10.0 to +8 |
| $L^*_g$: | 25-38 | 28-37 |

Moreover, coated articles including coatings according to certain example embodiments of this invention have the following optical characteristics when the coated article is an IG unit in certain example embodiments (e.g., for purposes of reference, when the coating is provided on a clear soda lime silica glass substrate 1 from 1 to 10 mm thick, preferably about 4 mm thick). It is noted that U-value is measured in accordance with EN 673.

TABLE 4

Example Optical Characteristics (IG Unit)

| Characteristic | General | More Preferred |
|---|---|---|
| $T_{vis}$ (or TY)(Ill. C, 2 deg.): | >=60% | >=70% |
| $a^*_t$ (Ill. C, 2°): | −10 to +10 | −8 to +8 |
| $b^*_t$ (Ill. C, 2°): | −10 to +10 | −8 to +8 |
| $R_{outside}Y$ (Ill. C, 2 deg.): | <=18% | <=16% |
| $a^*_{out}$ (Ill. C, 2°): | −10 to +10 | −8 to +8 |
| $b^*_{out}$ (Ill. C, 2°): | −10.0 to +10.0 | −9 to +9 |
| $R_{inside}Y$ (Ill. C, 2 deg.): | <=18% | <=16% |
| $a^*_{inside}$ (Ill. C, 2°): | −10 to +10 | −8 to +8 |
| $b^*_{inside}$ (Ill. C, 2°): | −14 to +10 | −10 to +9 |
| U-value (IG)(W/($m^2$ K)): | <=1.25 | <=1.15 |

Figure 2:
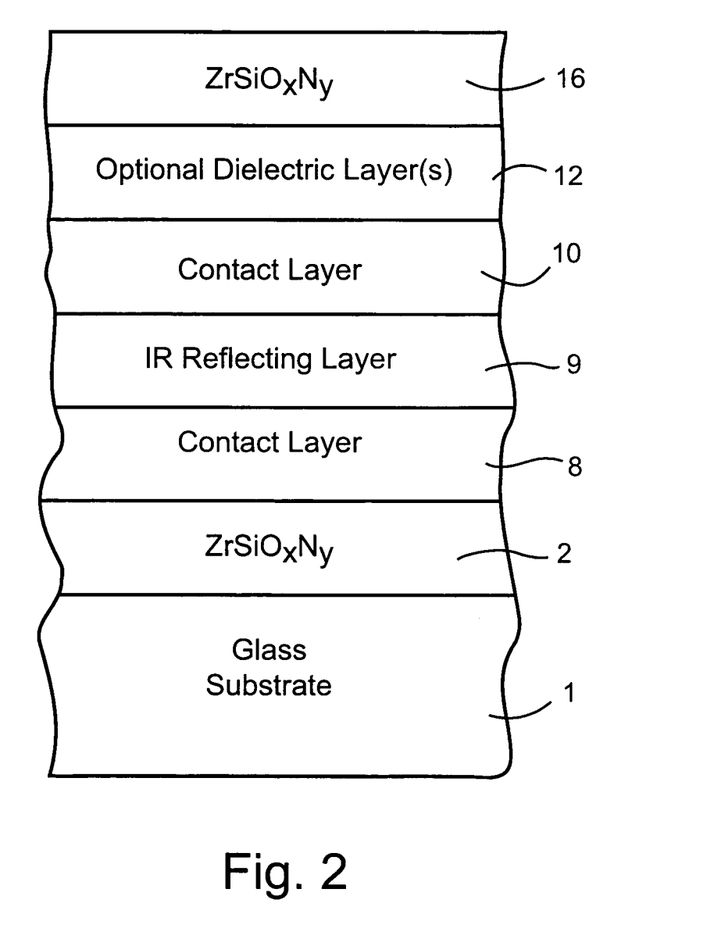
FIG. 2 is a cross sectional view of a coated article according to another example embodiment of this invention.

FIG. 2 is a cross sectional view of another example embodiment of this invention. The coated article of the FIG. 2 embodiment includes glass substrate 1, dielectric layer 2, lower contact layer 8, IR reflecting layer 9, upper contact layer 10, optional dielectric layer(s) 12, and dielectric layer 16. Contact layers 8 and 10 may be of materials such as $NiCrO_x$, NiCr, or zinc oxide (which may or may not be doped with another material such as Al alternative embodiments). Other layers may also be provided. One or both of layers 2 and 16 may be of or include zirconium silicon oxynitride in certain example embodiments of this invention. Thus, zirconium silicon oxynitride may be used as an overcoat of a coating in certain example embodiments of this invention. The example characteristics set forth above in Tables 2-4 may apply to the FIG. 2 embodiment in certain instances.

Figure 3:
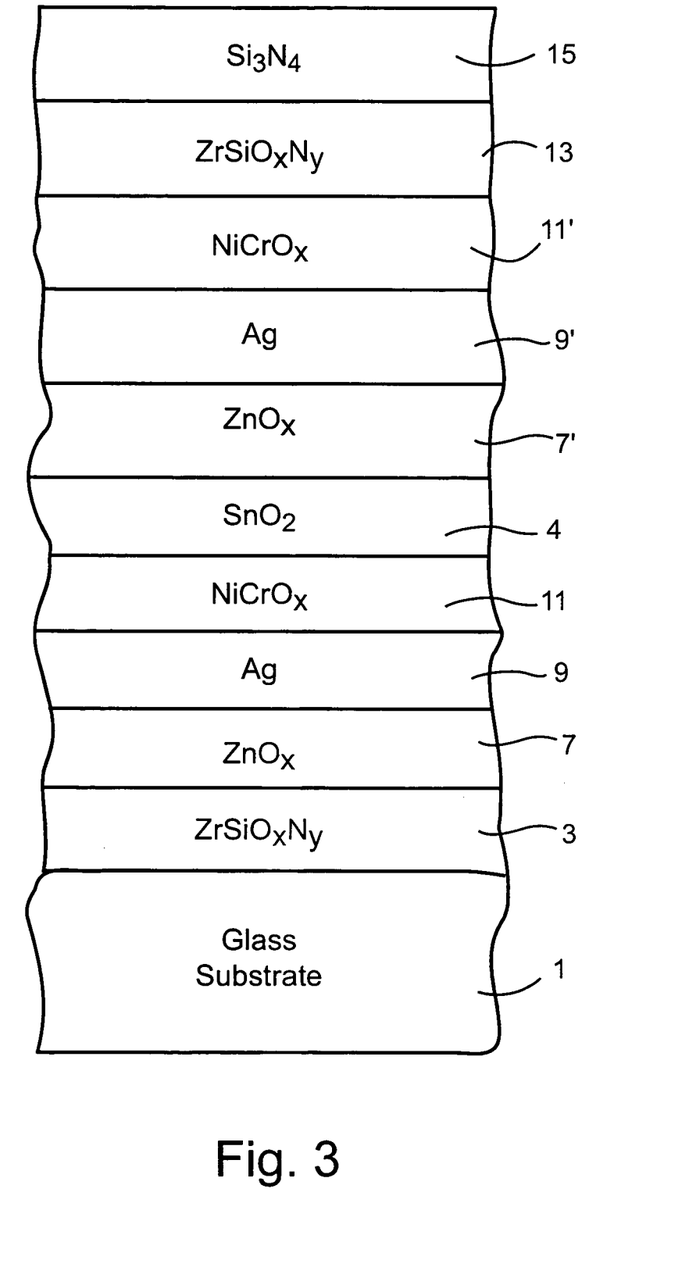
FIG. 3 is a cross sectional view of a coated article according to another example embodiment of this invention.

FIG. 3 is a cross sectional view of another example embodiment of this invention. FIG. 3 illustrates that zirconium silicon oxynitride layer(s) may be used in double-silver stacks as well in certain example embodiments of this invention. The coating in the FIG. 3 embodiment includes IR reflecting layers 9 and 9', contact layers 7, 7', 11 and 11', zirconium silicon oxynitride layer 3, 13, dielectric and possible overcoat layer 15, and metal oxide dielectric layer 4. As mentioned above, the zinc oxide contact layers 7 and 7' may be doped with other material such as Al in certain example embodiments, and the contact layers 11, 11' may be of or include an oxide of Ni and/or Cr in certain example embodiments. One or both of dielectric layers 3 and 13 may be of or include zirconium silicon oxynitride in certain example embodiments. As mentioned above, this particular coating is for purposes of example only and is not intended to be limiting unless expressly claimed. As with other embodiments herein, zirconium silicon oxynitride layer 3 may or may not be in direct contact with the glass substrate 1. Thus, another layer(s) may be provided between the substrate 1 and layer 3 in certain example instances.

Figure 5:
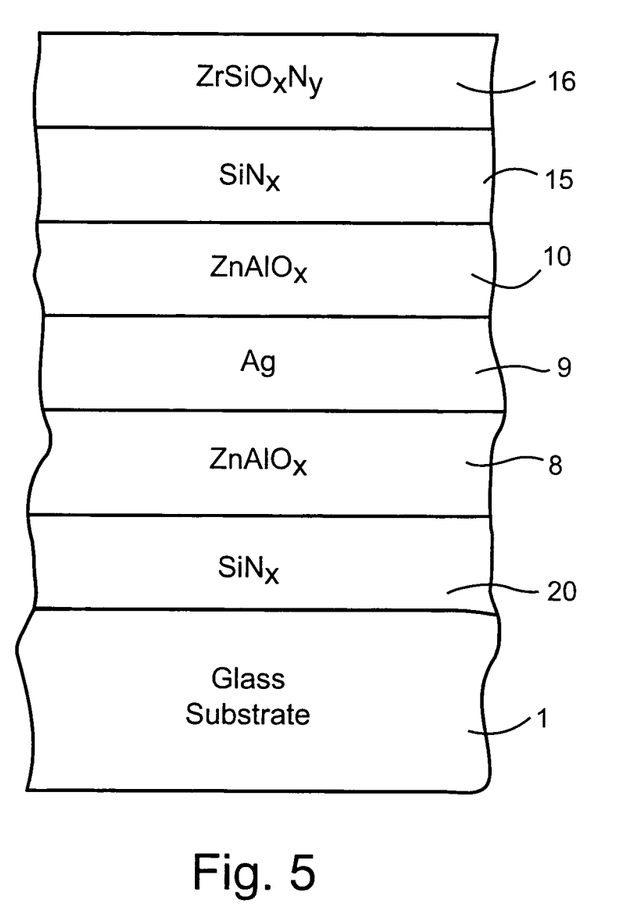
FIG. 5 is a cross sectional view of a coated article according to another example embodiment of this invention.
Figure 6:
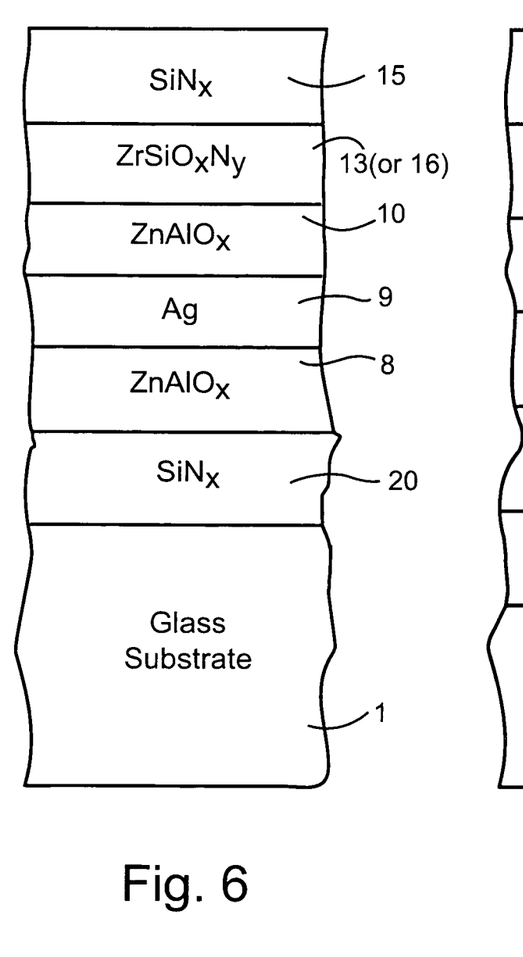
FIG. 6 is a cross sectional view of a coated article according to another example embodiment of this invention.
Figure 7:
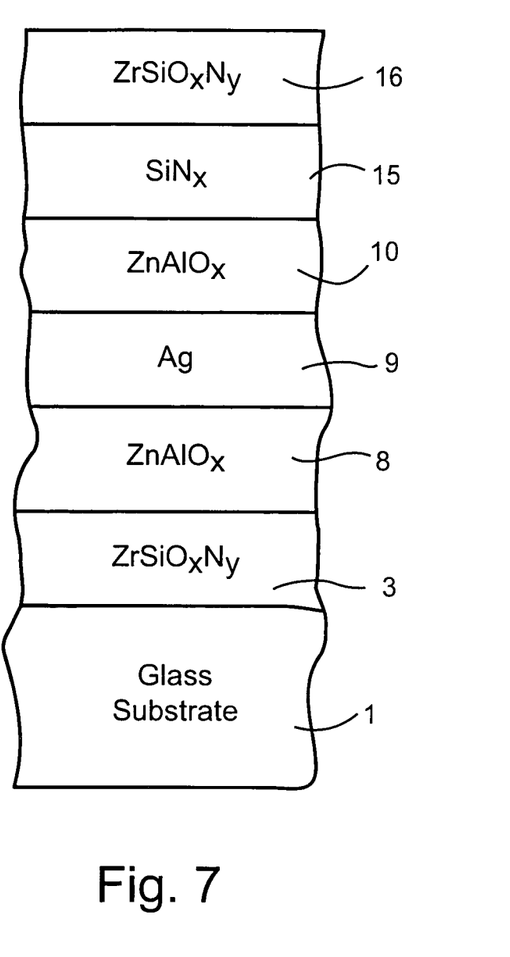
FIG. 7 is a cross sectional view of a coated article according to another example embodiment of this invention.

FIGS. 5-7 illustrate other example embodiments of this invention. As explained above, zirconium silicon oxynitride may be used as a replacement for silicon nitride in a coating, or alternatively may be used as an additional layer directly on top of and/or directly under a layer of or including silicon nitride. Surprisingly, this results in improved chemical and heat stability in certain example embodiments.

The FIG. 5 embodiment includes a coating which includes a dielectric layer of or including silicon nitride 20, lower contact layer 8 of a material such as zinc oxide (which may optionally be doped with aluminum in certain example embodiments as shown in FIG. 5), NiCrO$_x$ or the like, IR reflecting layer 9 of silver or the like, upper contact layer 10 of a material such as zinc oxide (which may optionally be doped with aluminum in certain example embodiments), dielectric layer 15 of or including silicon nitride or the like, and an overcoat of or including zirconium silicon oxynitride 16. It has been found that by using zirconium silicon oxynitride as a top or overcoat layer 16 with silicon nitride 15 underneath the same as shown in FIG. 5, the coated article realizes a higher light transmission and a significant drop in sheet resistance—both of which are unexpected improvements/results. Unexpected UV advantages are also realized as discussed above, due to the use of zirconium silicon oxynitride. This embodiment may be heat treated (thermally tempered with the coating thereon) in certain example embodiments of this invention.

In certain example embodiments of the FIG. 5 embodiment, layers 20 and 15 may each be from about 100 to 300 Å thick (most preferably about 200 Å thick), layers 8 and 10 may each be about 100 to 300 Å thick (most preferably about 180 Å thick), IR reflecting layer 9 may be from about 80 to 200 Å thick (most preferably about 120 Å thick), and zirconium silicon oxynitride layer 16 may be from about 100 to 300 Å thick (most preferably about 200 Å thick). The thicknesses of the different layers can be adapted to the different possible uses of the coating (e.g., as coated or heat treatable).

FIG. 6 illustrates another example embodiment of this invention. The FIG. 6 embodiment is similar to the FIG. 5 embodiment, except that the order of layers 15 and 16 has been switched. After switching the order of these layers, the light transmission and sheet resistance remain almost at the same level even after optional heat treatment (HT) such as thermal tempering. Again, as explained above, the use of zirconium silicon oxynitride in layer 13 (or 16) results in improved chemical and heat stability, in addition to the example UV advantages discussed herein.

FIG. 7 illustrates another example embodiment of this invention. The FIG. 7 embodiment is similar to the FIG. 5 embodiment, except that the lower silicon nitride layer has been replaced with zirconium silicon oxynitride layer 3. Again, the use of zirconium silicon oxynitride results in improved chemical and heat stability, as well as the example UV advantages discussed herein.

Optionally, in any of the FIG. 5-7 embodiments, a contact layer of NiCrO$_x$ may be provided between the IR reflecting layer 9 and the zinc oxide based layer 10 in certain example embodiments of this invention. This has been found to improve durability in certain example embodiments of this invention.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article, the method comprising:
    providing a substrate;
    sputtering a target comprising zirconium and silicon in an atmosphere comprising oxygen and nitrogen in order to form a layer comprising zirconium silicon oxynitride, wherein the target comprises more zirconium than silicon;
    sputtering a target comprising zinc in order to form a layer comprising zinc oxide located over and directly contacting the layer comprising zirconium silicon oxynitride; and
    providing an IR reflecting layer on the substrate over and directly contacting the layer comprising zinc oxide.

2. The method of claim 1, wherein a ratio of nitrogen/oxygen gas in a sputter chamber used in forming the layer comprising zirconium silicon oxynitride is from about 1 to 25.

3. The method of claim 1, wherein a ratio of nitrogen/oxygen gas in a sputter chamber used in forming the layer comprising zirconium silicon oxynitride is from about 2 to 18.

4. The method of claim 1, wherein a ratio of nitrogen/oxygen gas in a sputter chamber used in forming the layer comprising zirconium silicon oxynitride is from about 2 to 10.

5. The method of claim 1, further comprising changing a refractive index (n) and an extinction coefficient (k) of the layer comprising zirconium silicon oxynitride, and thus UV radiation absorption, by adjusting oxygen gas flow into a deposition chamber used in forming the layer comprising zirconium silicon oxynitride.

6. The method of claim 1, wherein the coating has a visible transmission of at least about 50%.

7. The method of claim 1, wherein the atmosphere includes argon gas in addition to oxygen and nitrogen gas, and wherein the amount of argon gas in the atmosphere is greater than the amount of oxygen gas but less than the amount of nitrogen gas in the atmosphere, in forming the layer comprising zirconium silicon oxynitride.

8. The method of claim 1, wherein the layer comprising zirconium silicon oxynitride contains more zirconium than silicon, and oxygen content of the layer comprising zirconium silicon oxynitride is provided in an amount so that the layer comprising zirconium silicon oxynitride at a wavelength of 550 nm has an index of refraction (n) of from about 1.8 to 2.4.

9. The method of claim 1, wherein the layer comprising zirconium silicon oxynitride contains more zirconium than silicon.

10. The method of claim 1, wherein the coated article includes first and second layers comprising zirconium silicon oxynitride.

11. A method of making a coated article, the method comprising:
   providing a glass substrate;
   sputtering a target comprising zirconium and silicon in an atmosphere comprising oxygen and nitrogen in order to form at least one layer comprising zirconium silicon oxynitride;
   sputtering a target comprising zinc in order to form a layer comprising zinc oxide located over and directly contacting the layer comprising zirconium silicon oxynitride;
   providing an IR reflecting layer on the substrate over and directly contacting the layer comprising zinc oxide; and
   wherein the layer comprising zirconium silicon oxynitride contains more zirconium than silicon.

12. The method of claim 11, wherein a Zr/Si ratio in the layer comprising zirconium silicon oxynitride is from about 1.0 to 2.0.

13. The method of claim 11, wherein the coated article includes first and second layers comprising zirconium silicon oxynitride.

14. The method of claim 11, wherein an atmosphere in which the layer comprising zirconium silicon oxynitride is sputter-deposited includes argon gas in addition to oxygen and nitrogen gas, and wherein the amount of argon gas in the atmosphere is greater than the amount of oxygen gas but less than the amount of nitrogen gas in the atmosphere, in forming the layer comprising zirconium silicon oxynitride.

15. A method of making a coated article, the method comprising:
   providing a glass substrate;
   sputtering a target comprising zirconium and silicon in an atmosphere comprising oxygen and nitrogen in order to form a layer comprising zirconium silicon oxynitride;
   sputtering a target comprising zinc in order to form a layer comprising zinc oxide located over and directly contacting the layer comprising zirconium silicon oxynitride; and
   sputter-depositing an IR reflecting layer comprising silver on the glass substrate over and directly contacting the layer comprising zinc oxide.

16. The method of claim 15, wherein a ratio of nitrogen/oxygen gas in a sputter chamber used in forming the layer comprising zirconium silicon oxynitride is from about 1 to 25.

17. The method of claim 15, wherein a ratio of nitrogen/oxygen gas in a sputter chamber used in forming the layer comprising zirconium silicon oxynitride is from about 2 to 18.

18. The method of claim 15, wherein the coating has a visible transmission of at least about 50%.

19. The method of claim 15, wherein the atmosphere includes argon gas in addition to oxygen and nitrogen gas, and wherein the amount of argon gas in the atmosphere is greater than the amount of oxygen gas but less than the amount of nitrogen gas in the atmosphere, in forming the layer comprising zirconium silicon oxynitride.

20. The method of claim 15, wherein the layer comprising zirconium silicon oxynitride contains more zirconium than silicon.

21. The method of claim 15, wherein oxygen content of the layer comprising zirconium silicon oxynitride is provided in an amount so that the layer comprising zirconium silicon oxynitride at a wavelength of 550 nm has an index of refraction (n) of from about 1.8 to 2.4.

* * * * *